(12) United States Patent
Huang

(10) Patent No.: US 8,192,211 B1
(45) Date of Patent: Jun. 5, 2012

(54) RETRACTABLE USB MEMORY STICK WITH A SAFETY HOOK

(75) Inventor: Joseph Huang, Taoyuan (TW)

(73) Assignee: Ho E Screw & Hardware Co., Ltd., Lu-Chu, Taoyuan (TW)

( * ) Notice: Subject to any disclaimer, the term of this patent is extended or adjusted under 35 U.S.C. 154(b) by 17 days.

(21) Appl. No.: 13/015,569

(22) Filed: Jan. 27, 2011

(51) Int. Cl.
*H01R 13/60* (2006.01)
(52) U.S. Cl. ........................................ 439/131
(58) Field of Classification Search ............... 439/131, 439/140; 340/825.24, 825.25; 700/130–144
See application file for complete search history.

(56) References Cited

U.S. PATENT DOCUMENTS

| | | | |
|---|---|---|---|
| 7,361,032 B2 * | 4/2008 | Loftus | 439/131 |
| 7,462,044 B1 * | 12/2008 | Regen et al. | 439/131 |
| 7,558,069 B2 * | 7/2009 | Chung | 361/737 |
| 7,674,120 B2 * | 3/2010 | Morganstern et al. | 439/131 |
| 7,740,492 B2 * | 6/2010 | Dei Rossi et al. | 439/131 |
| 7,811,101 B2 * | 10/2010 | Tang et al. | 439/131 |
| 7,872,871 B2 * | 1/2011 | Hiew et al. | 361/730 |
| 7,980,867 B2 * | 7/2011 | Dei Rossi et al. | 439/131 |
| 8,058,840 B2 * | 11/2011 | Daniel et al. | 320/112 |
| 8,102,662 B2 * | 1/2012 | Hiew et al. | 361/752 |

FOREIGN PATENT DOCUMENTS

TW  M377749  4/2010

* cited by examiner

*Primary Examiner* — Tulsidas C Patel
*Assistant Examiner* — Phuongchi Nguyen
(74) *Attorney, Agent, or Firm* — Guice Patents PLLC

(57) ABSTRACT

A retractable USB memory stick includes a metal casing having a longitudinal sliding slot, first and second locating holes located on opposing ends of the longitudinal sliding slot and a hook located on the rear side and defining an access gap, a PC board having a USB plug and a memory IC board, and an insulation PC board holder holding the PC board and slidably mounted in the metal casing. The insulation PC board holder has a sliding block supported on a spring strip and inserted into the longitudinal sliding slot of the metal casing, retaining blocks protruded from the sliding block for selectively engaging the first locating hole or second locating hole to lock the insulation PC board holder to the metal casing in extended or received positions, and a latch located on the rear side and movable with the insulation PC board holder to close/open the access gap.

8 Claims, 7 Drawing Sheets

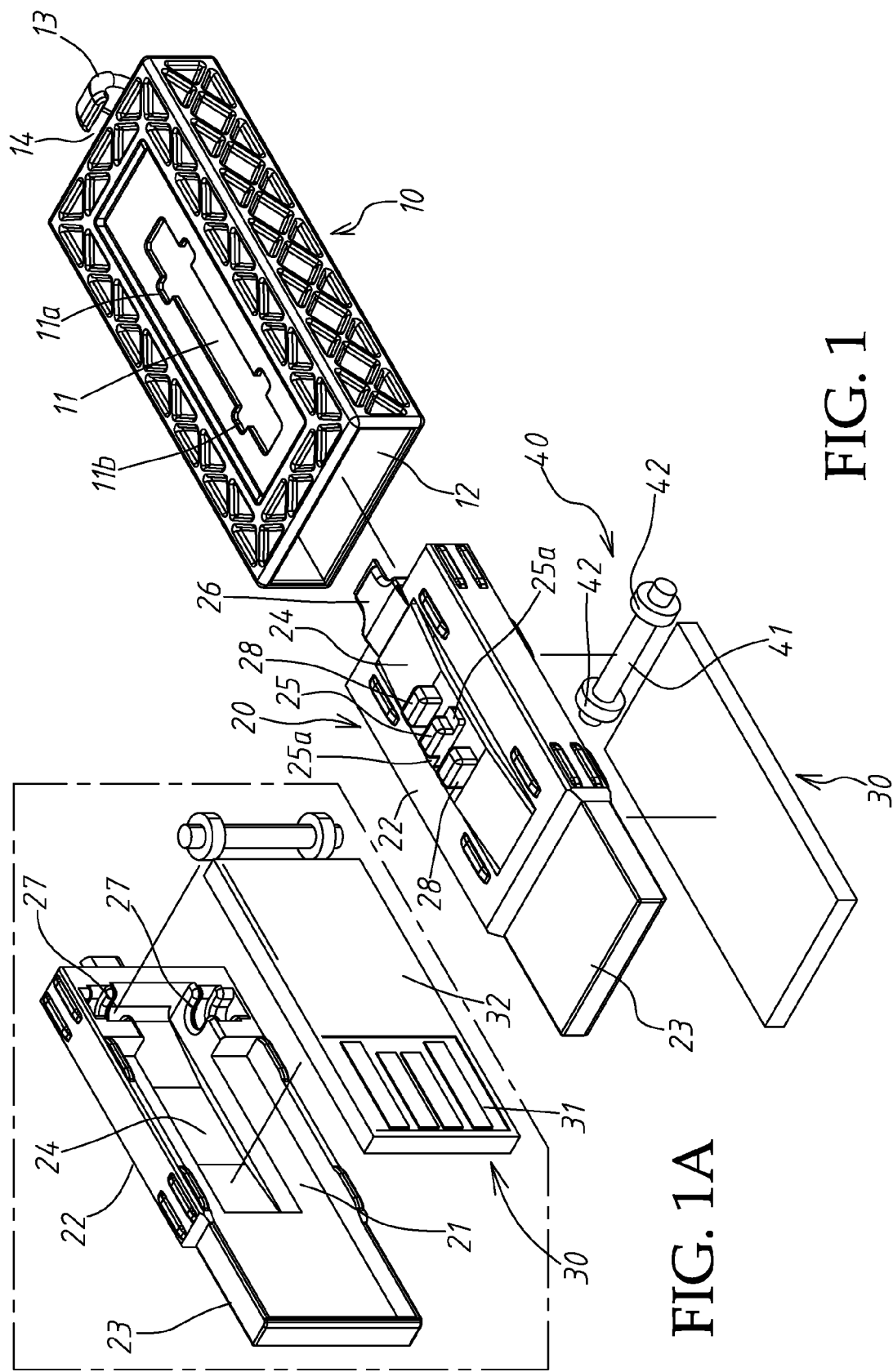

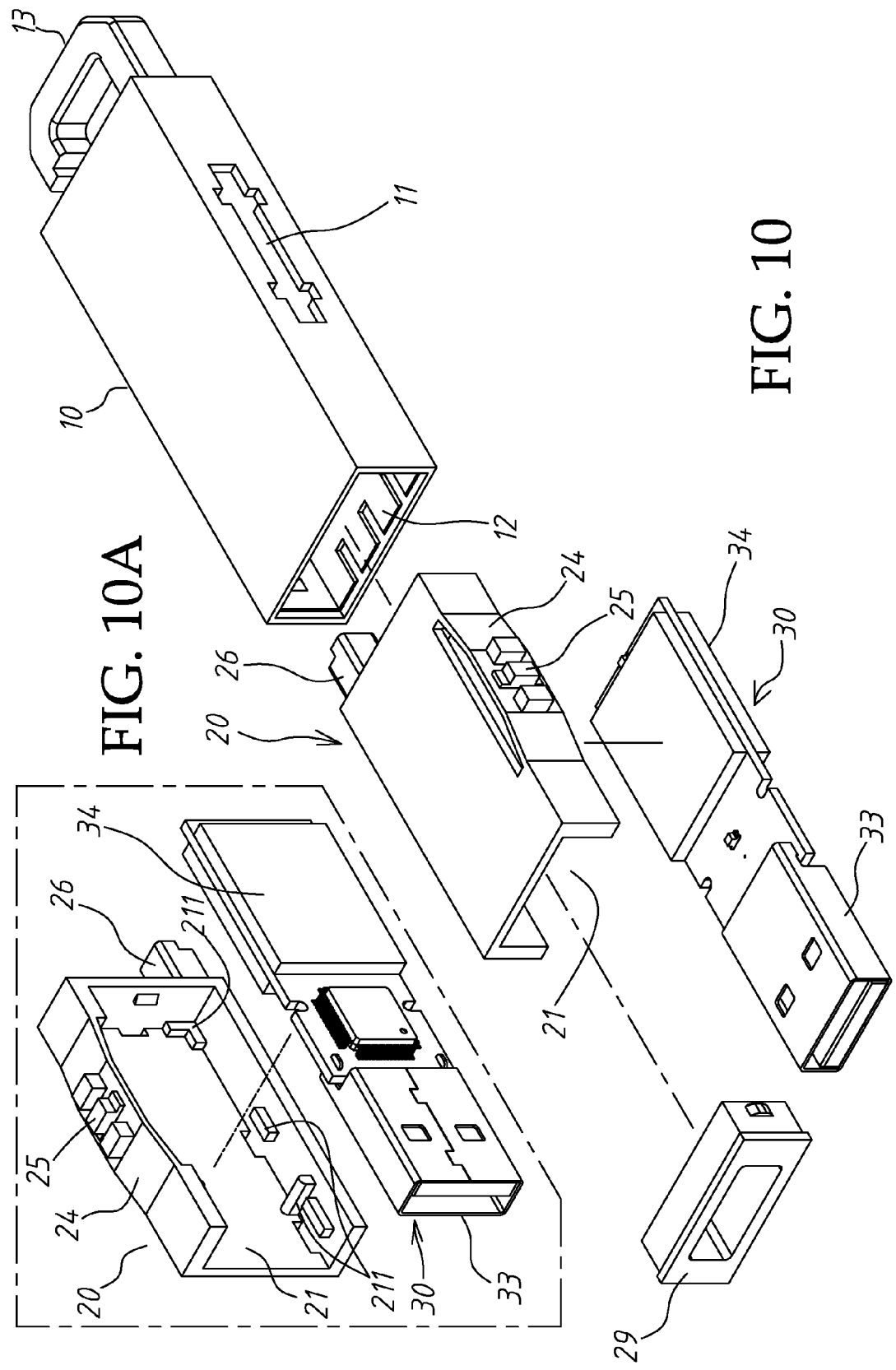

RETRACTABLE USB MEMORY STICK WITH A SAFETY HOOK

BACKGROUND OF THE INVENTION

1. Field of the Invention

The present invention is a retractable USB memory stick and more particularly, to such a retractable USB memory stick provided with a safety hook that can be opened or closed.

2. Description of the Related Art

USB memory stick is a mobile data storage device connectable to a computer for data access and convenient for carrying. Following fast development of technology, the storage capacity and application range of USB memory stick have been greatly improved. For example, 1G, 4G, 8G, 16G as well as 32G USB memory sticks are commercially available.

A retractable USB memory stick is known comprising a PC board having a USB interface circuit and a memory IC package, an insulative PC board holder holding the PC board, and a housing formed of two insulative half shells for accommodating the insulative PC board holder. The insulative PC board holder has a push member extended out of the housing and operable to move the USB interface circuit in and out of the housing.

Taiwan Patent Utility Model M377749 discloses a retractable USB memory stick with a hook, which is an invention of the present inventor. According to this design, the retractable USB memory stick comprises a metal casing, a PC board and an insulation PC board holder. The PC board is detachably accommodated in a recess in the insulation PC board holder. The insulation PC board holder comprises a base portion, a hook located on the rear side of the base portion, a front extension located on the front side of the base portion, a sliding block supported on a bridged spring strip at the base portion. The metal casing has a sliding slot, which receives the sliding block of the insulation PC board holder to guide sliding movement of the insulation PC board holder relative to the metal casing, and multiple positioning holes located on the sliding slot at different locations. The sliding block of the insulation PC board holder is selectively forced into friction engagement with one of the positioning holes. By means of the hook, the retractable USB memory stick can be fastened to a chain. This design facilitates replacement of the metal casing and the PC board.

When the sliding block is positioned in the first positioning hole of the metal casing, the front extension of the insulation PC board holder is extended out of the front opening of the metal casing. When the sliding block is positioned in the second positioning hole of the metal casing, the hook of the insulation PC board holder is extended out of the rear opening of the metal casing and the access gap is kept inside the metal casing. When the sliding block is positioned in the third positioning hole of the metal casing, the front extension and base portion of the insulation PC board holder are received inside the metal casing, the hook of the insulation PC board holder is extended out of the rear opening of the metal casing and the access gap is disposed outside the metal casing. Based on the aforesaid arrangement, the retractable USB memory stick can be fastened to a chain by the hook.

According to the aforesaid retractable USB memory stick, the hook is located on the rear side of the insulation PC board holder and defines an access gap, and the metal casing provides three positioning holes for the positioning of the sliding block selectively. The design of the three positioning holes complicates the fabrication of the metal casing and the operation of the retractable USB memory stick. The access gap will be kept inside the metal casing when the sliding block is positioned in the second positioning hole of the metal casing. However, the sliding block may be forced away from the second positioning hole to the third positioning hole accidentally upon an impact, causing the access gap to be exposed to the outside of the metal casing. When this condition occurs, the hook may fall from the chain. Therefore, an improvement in this regard is necessary.

SUMMARY OF THE INVENTION

The present invention has been accomplished under the circumstances in view. It is therefore the main object of the present invention to provide a retractable USB memory stick, which eliminates the drawbacks of the aforesaid prior art design. It is another object of the present invention to provide a retractable USB memory stick, which simplifies fabrication and operation.

To achieve these and other objects of the present invention, a retractable USB memory stick comprises a metal casing, a PC board and an insulation PC board holder. The metal casing comprises opposing front and rear sides, a longitudinal sliding slot, a first locating hole and a second locating hole respectively extending across the longitudinal sliding slot near two distal ends of the longitudinal sliding slot, a front opening located on the front side thereof, and a hook extended from the rear side thereof and defining with the rear side an access gap. The PC board comprises a USB plug and a memory IC board. The insulation PC board holder is slidably mounted in the metal casing, comprising recess defined in the bottom side thereof for securing the PC board, a spring strip bridged on a selected location, a sliding block located on the spring strip and inserted into the sliding slot of the metal casing to guide sliding movement of the insulation PC board holder in and out of the front opening of the metal casing between a received position and an extended position, two retaining blocks protruded from two opposite lateral sides of the sliding block for selectively engaging the first locating hole or the second locating hole of the metal casing to lock the insulation PC board holder to the metal casing in the received position or extended position, and a latch extended from the rear side thereof for stopping against the hook to close the access gap when the insulation PC board holder is moved into the inside of the metal casing and received in the received position. The latch is kept away from the hook to open the access gap when the insulation PC board holder is moved out of the received position to the extended position.

Further, the insulation PC board holder comprises two pivot holders bilaterally disposed in the recess near the rear side, and a roller assembly mounted in the pivot holders. The roller assembly comprises a pivot shaft pivotally mounted in the pivot holders, and two rollers respectively mounted on the pivot shaft near two distal ends thereof and kept in contact with an inner bottom surface of the metal casing.

Further, the hook can be extended from the middle part of the bottom wall of the metal casing. Alternatively, the hook can be extended from one lateral sidewall of the metal casing.

Further, the longitudinal sliding slot of the metal casing can be located on the top wall of the metal casing. Alternatively, the longitudinal sliding slot of the metal casing can be located on one lateral sidewall of the metal casing.

Further, because the first locating hole and the second locating hole are kept apart at a certain distance, the latch will be not forced away from the hook accidentally upon an impact, assuring high level of safety.

Further, the arrangement of the roller assembly in the insulation PC board holder facilitates smooth sliding movement of the insulation PC board holder relative to the metal casing and avoiding sticking.

BRIEF DESCRIPTION OF THE DRAWINGS

FIG. 1 is an exploded view of a retractable USB memory stick in accordance with a first embodiment of the present invention.

FIG. 1A is an oblique bottom exploded view of the insulation PC board holder, the PC board and the roller assembly shown in FIG. 1.

FIG. 10 is an exploded view of a retractable USB memory stick in accordance with a third embodiment of the present invention.

FIG. 10A is an oblique bottom exploded view of the insulation PC board holder and the PC board shown in FIG. 10.

DETAILED DESCRIPTION OF THE PREFERRED EMBODIMENT

Figure 2A:
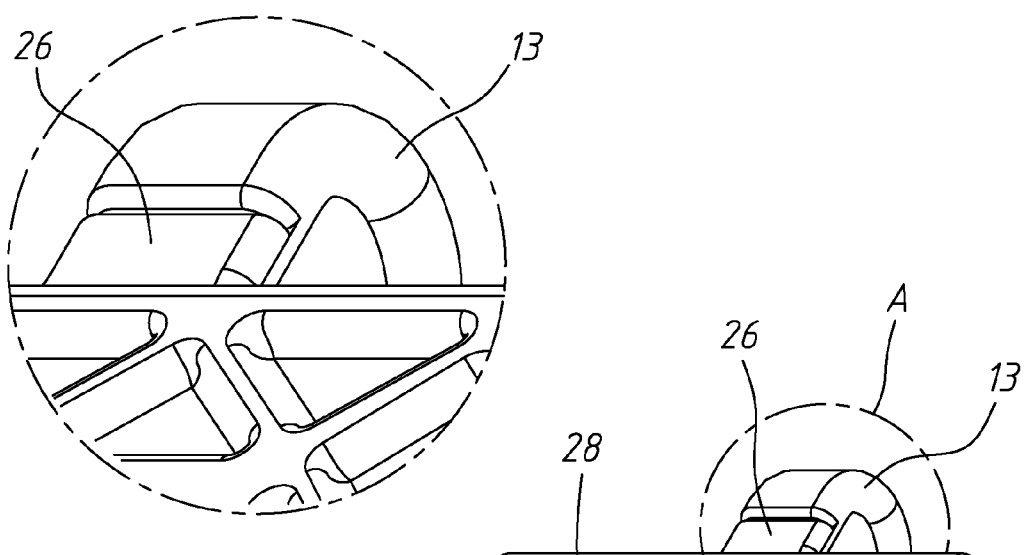
FIG. 2A is an enlarged view of part A of FIG. 2.
Figure 2:
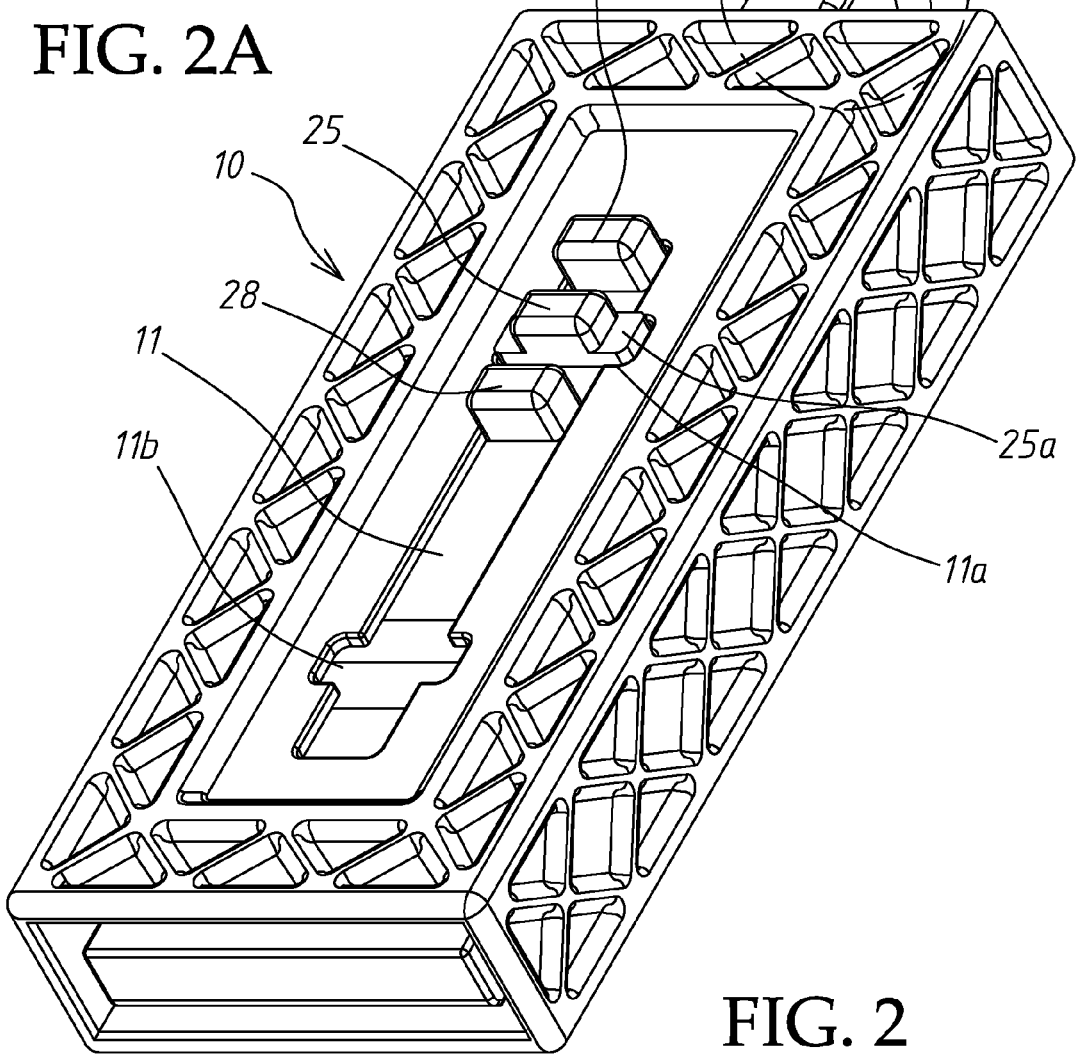
FIG. 2 is an elevational assembly view of the retractable USB memory stick in accordance with the first embodiment of the present invention.

Referring to FIGS. 1 and 2, a retractable USB memory stick with a safety hook in accordance with a first embodiment of the present invention is shown comprising a metal casing 10, an insulation PC board holder 20, a PC board 30 and roller assembly 40.

The metal casing 10 is a box member having a longitudinal sliding slot 11 cut through the peripheral wall thereof, a first locating hole 11a cut through the peripheral wall across one end of the sliding slot 11, a second locating hole 11b cut through the peripheral wall across the other end of the sliding slot 11, a front opening 12 located on the front side thereof, and a hook 13 extended from the rear side thereof and defining an access gap 14.

Referring to FIG. 1A, the insulation PC board holder 20 is slidably mounted in the metal casing 10, comprising a base portion 22, a front extension 23 extended from one end (the front end) of the base portion 22 and configured subject to a standard USB plug, a recess 21 defined in the base portion 22 and the front extension 23 at the bottom side for securing the PC board 30, a spring strip 24 bridged on the top side of the base portion 22, a sliding block 25 located on the spring strip 24 and forced by the spring power of the spring strip 22 into the sliding slot 11 of the metal casing 10 after insertion of the insulation PC board holder 20 in the metal casing 10 two guide blocks 28 located on the spring strip 24 and respectively disposed at front and rear sides relative to the sliding block 25 and respectively inserted into the sliding slot 11, two retaining blocks 25a respectively protruded from two opposite lateral sides of the sliding block 25 for selectively engaging the first locating hole 11a or second locating hole 11b of the metal casing 10 to lock the insulation PC board holder 20 in an extended position or a received position, a latch 26 extended from the other end (the rear end) of the base portion 22 opposite to the front extension 23 and adapted for stopping against the free end of the hook 13 to close the access gap 14 (see FIG. 2A), and two pivot holders 27 bilaterally disposed in the recess 21 near the rear end of the base portion 22.

The PC board 30 comprises a USB interface circuit 31 and a memory IC package 32. As shown in FIG. 2, the USB interface circuit 31 is disposed at the front side of the memory IC package 32. Further, the PC board 30 is detachably accommodated in the recess 21 of the insulation PC board holder 20.

The roller assembly 40 comprises a pivot shaft 41, and two rollers 42 respectively mounted on the pivot shaft 41 near the two distal ends thereof. The pivot shaft 41 is pivotally mounted in the pivot holders 27 of the insulation PC board holder 20. During sliding movement of the insulation PC board holder 20 relative to the metal casing 10, the rollers 42 are kept in contact with the inner bottom surface of the metal casing 10.

Figure 3:
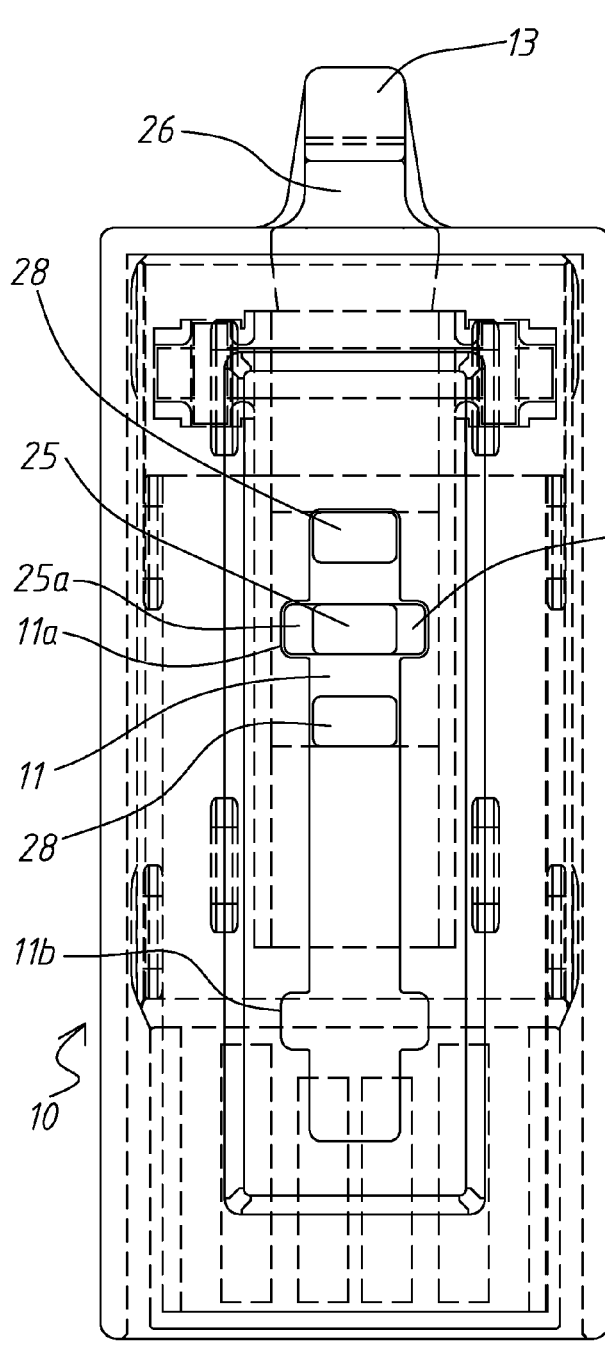
FIG. 3 is a plain view of the first embodiment of the present invention, illustrating the retaining blocks of the insulation PC board holder engaged into the first locating hole.
Figure 4:
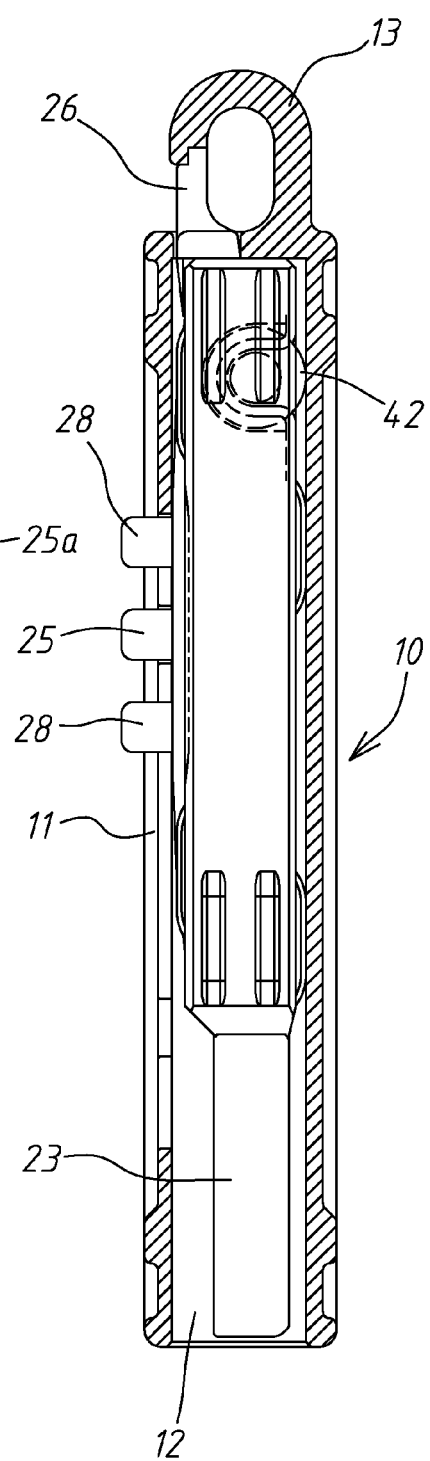
FIG. 4 is a sectional view of FIG. 3.

Referring to FIGS. 3 and 4, when the retaining blocks 25a are engaged into the first locating hole 11a of the metal casing 10, to lock the insulation PC board holder 20 in the received position, the insulation PC board holder 20 is received inside the metal casing 10, and the latch 26 extends out of the metal casing 10 and stopped against the free end of the hook 13 to close the access gap 14, and therefore the latch 26 and the hook 13 form a safety hook. Further, as illustrated in FIG. 4, the spring strip 24 imparts an upward pressure to the sliding block 25 and the retaining blocks 25a, forcing the retaining blocks 25a into friction engagement with the first locating hole 11a of the metal casing 10. The rollers 42 of the roller assembly 40 are kept in contact with the inner bottom surface of the metal casing 10.

Figure 5:
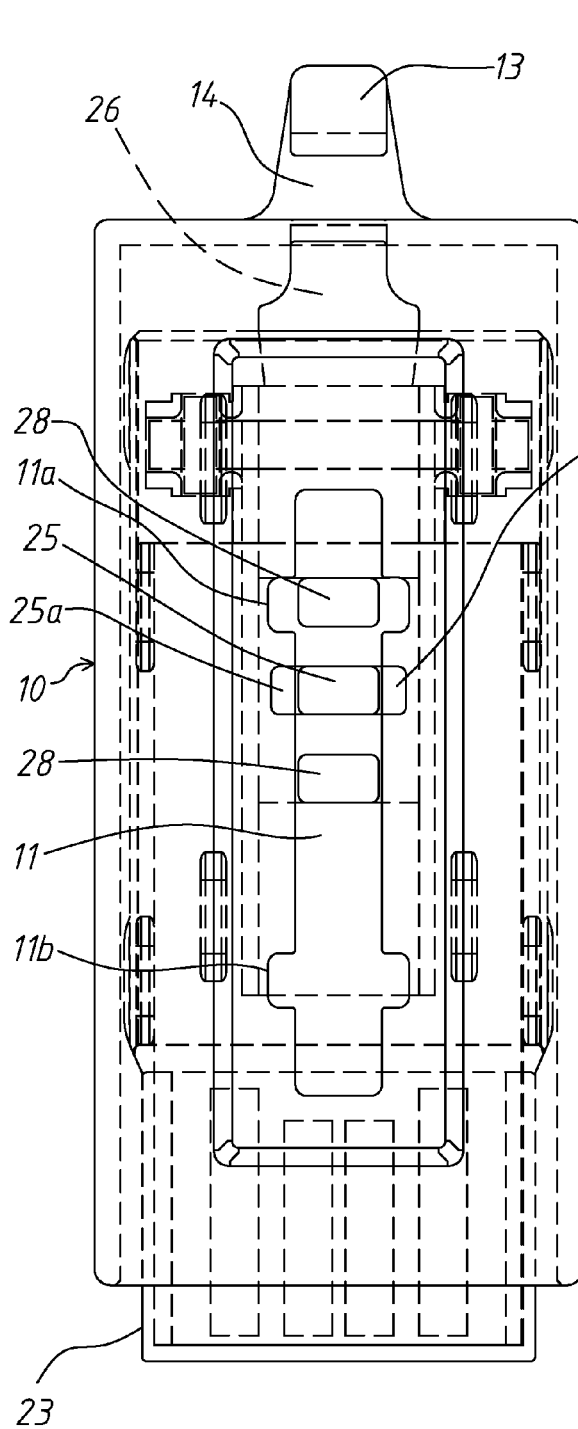
FIG. 5 is a schematic plain view of the first embodiment of the present invention, illustrating the sliding block of the insulation PC board holder received in the longitudinal sliding slot of the metal casing.
Figure 6:
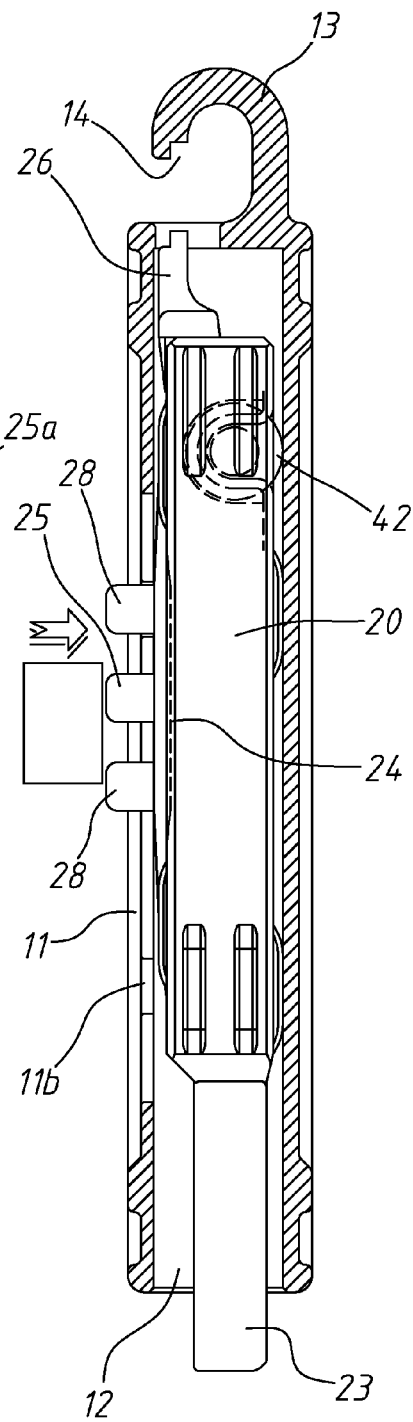
FIG. 6 is a sectional view of FIG. 5.

When wishing to change the insulation PC board holder 20 from the received position to the extended position, press the sliding block 25 and the guide blocks 28 to force the spring strip 24 downwards and to disengage the retaining blocks 25a from the first locating hole 11a of the metal casing 10 for allowing sliding movement of the insulation PC board holder 20 relative to the metal casing 10 from the received position toward the extended position, as shown in FIGS. 5 and 6. At this time, the latch 26 is moved away from the hook 13 and received inside the metal casing 10, and the front extension 23 of the insulation PC board holder 20 is moved out of the front opening 12 of the metal casing 10. Further, the rollers 42 of the roller assembly 40 are constantly kept in contact with the inner bottom surface of the metal casing 10 to facilitate sliding movement of the insulation PC board holder 20 relative to the metal casing 10.

Figures 7, 8:
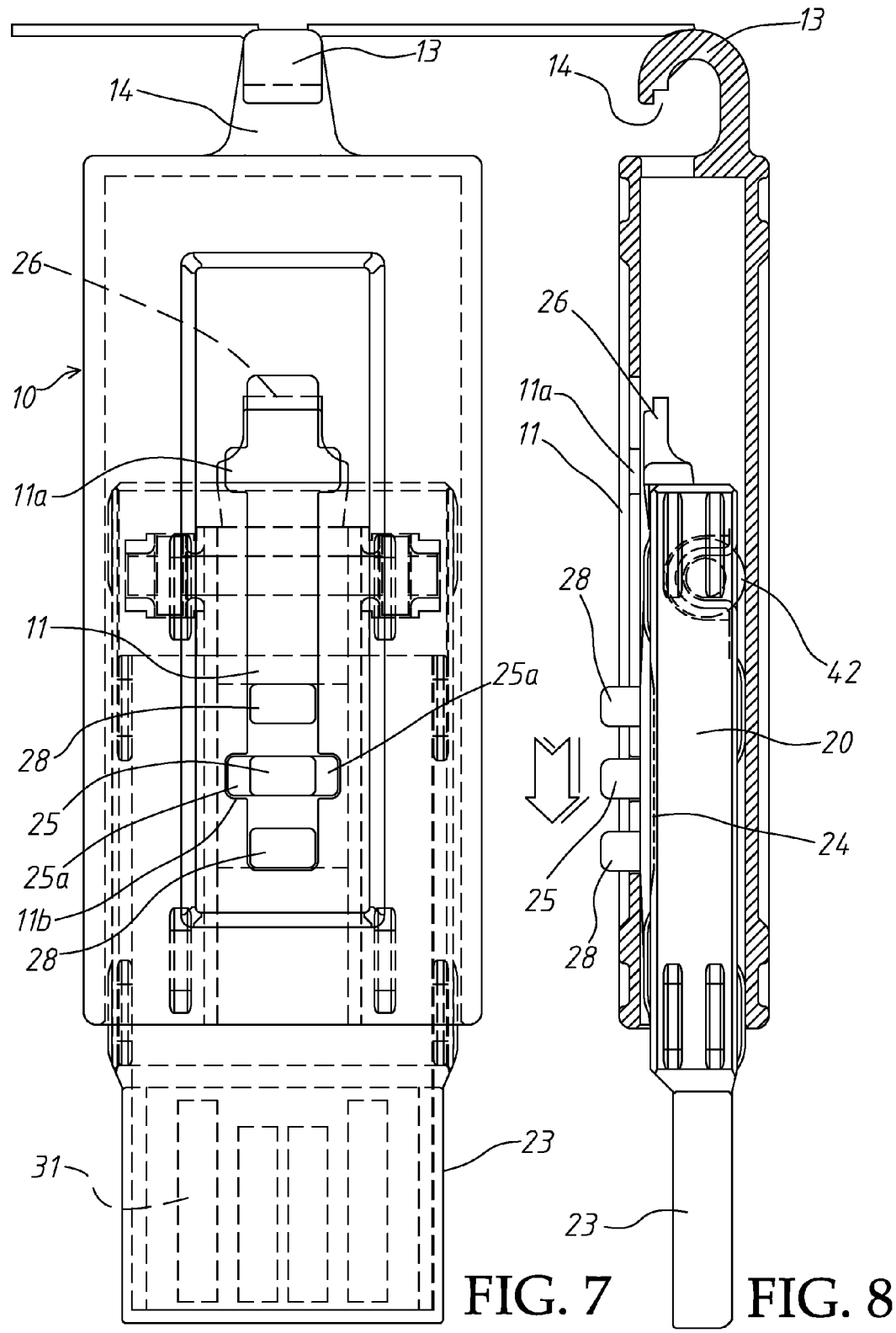
FIG. 7 is a plain view of the first embodiment of the present invention, illustrating the retaining blocks of the insulation PC board holder engaged into the second locating hole.
FIG. 8 is a sectional view of FIG. 7.

When the insulation PC board holder 20 is moved out of the metal casing 10 to the front limit position, i.e., the extended position, as shown in FIGS. 7 and 8, the retaining blocks 25a are forced into friction engagement with the second locating hole 11b of the metal casing 10. At this time, the latch 26 is received inside the metal casing 10 and the access gap 14 is left open for allowing the hook 13 to be hooked in or disengaged from a chain; the front extension 23 of the insulation PC board holder 20 and the USB interface circuit 31 of the PC board 30 are extended out of the front opening 12 of the metal casing 10 for insertion into a USB jack of an electronic device, for example, computer, for data access.

Subject to the aforesaid structural arrangement of the present invention, the latch 26 is movable relative to the hook 13 to open/close the access gap 14. Further, because the first locating hole 11a and the second locating hole 11b are kept apart at a certain distance, the safety hook will not be opened accidentally upon an impact, assuring high level of safety and high applicability.

Further, the arrangement of the roller assembly 40 in the insulation PC board holder 20 facilitates smooth sliding movement of the insulation PC board holder 20 relative to the metal casing 10 and avoiding sticking.

Figure 9:
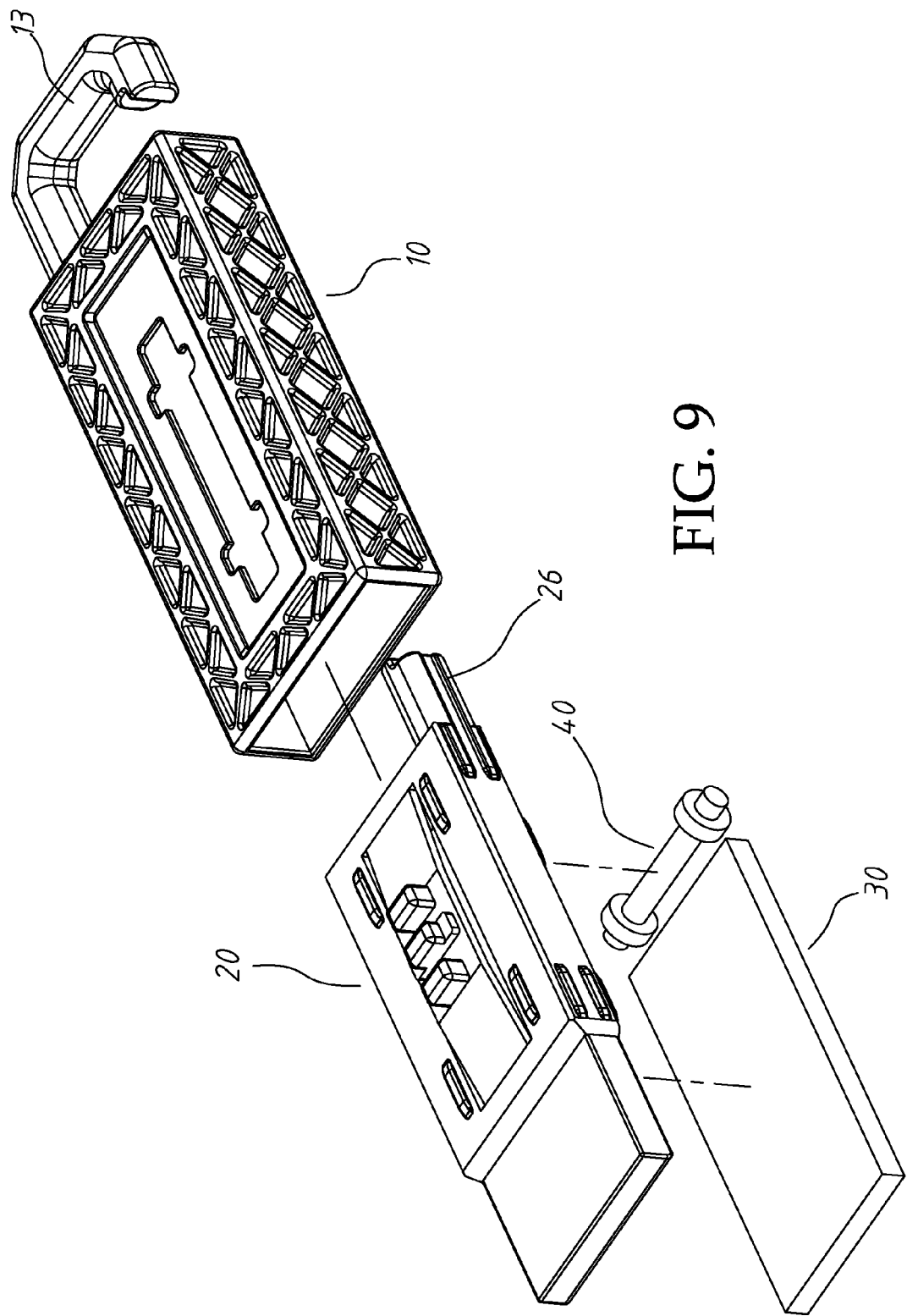
FIG. 9 is an exploded view of a retractable USB memory stick in accordance with a second embodiment of the present invention.

In the aforesaid first embodiment, the hook 13 extends from the middle part of the rear side of the bottom wall of the metal casing 10. In a second embodiment of the present invention, as shown in FIG. 9, the hook 13 extends from the rear side of one lateral side wall of the metal casing 10. This design enables the size of the hook 13 and the latch 26 to be made relatively lager.

FIGS. 10 and 10A illustrate a retractable USB memory stick with a safety hook in accordance with a third embodiment of the present invention. The safety hook of this third embodiment is substantially similar to the aforesaid second embodiment. As illustrated, the retractable USB memory stick with a safety hook in accordance with this third embodiment comprises a metal casing 10, an insulation PC board holder 20 and a PC board 30.

According to this third embodiment, the hook 13 extends from the rear side of one lateral side wall of the metal casing 10 to match the latch 26; the longitudinal sliding slot 11 is located on one lateral side wall of the metal casing 10; the spring strip 24 and the sliding block 25 are located on the corresponding lateral sidewall of the insulation PC board holder 20; the PC board 30 that is accommodated in the recess 21 of the insulation PC board holder 20 comprises a USB plug 33 and a memory IC board 34; the insulation PC board holder 20 comprises a plurality of locating blocks 211 disposed in the recess 21 for securing the PC board 30, and a front holder block 29 fixedly fastened to the front opening 12 of the metal casing 10 and adapted for supporting the USB plug 33 for enabling the USB plug 33 to be moved in and out of the front opening 12 of the metal casing 10 smoothly.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A retractable USB memory stick, comprising:
   a metal casing comprising opposing front and rear sides, a longitudinal sliding slot, a first locating hole and a second locating hole respectively extending across said longitudinal sliding slot near two distal ends of said longitudinal sliding slot, a front opening located on the front side thereof, and a hook extended from the rear side thereof and defining with the rear side an access gap;
   a PC board, said PC board comprising a USB plug and a memory IC board; and
   an insulation PC board holder slidably mounted in said metal casing, said insulation PC board holder comprising a base portion, a front extension, a recess defined in said base portion and said front extension at a bottom side for securing said PC board, a spring strip bridged on said base portion, a sliding block located on said spring strip and inserted into said sliding slot of said metal casing to guide sliding movement of said insulation PC board holder in and out of said front opening of said metal casing between a received position and an extended position, two retaining blocks protruded from two opposite lateral sides of said sliding block for selectively engaging said first locating hole or said second locating hole of said metal casing to lock said insulation PC board holder to said metal casing in one of said received position and said extended position, and a latch extended from a rear side of said base portion opposite to said front extension for stopping against said hook to close said access gap when said insulation PC board holder is moved into the inside of said metal casing and received in said received position, said latch being kept away from said hook to open said access gap when said insulation PC board holder is moved out of said received position to said extended position.

2. The retractable USB memory stick as claimed in claim 1, wherein said insulation PC board holder further comprises two pivot holders bilaterally disposed in said recess near the rear side of said base portion, a pivot shaft pivotally mounted in said pivot holders, and two rollers respectively mounted on said pivot shaft near two distal ends thereof and kept in contact with an inner bottom surface of said metal casing.

3. The retractable USB memory stick as claimed in claim 1, wherein said hook extends from a middle part of a bottom wall of said metal casing.

4. The retractable USB memory stick as claimed in claim 1, wherein said hook extends from one lateral sidewall of said metal casing.

5. The retractable USB memory stick as claimed in claim 1, wherein said longitudinal sliding slot of said metal casing is located on a top wall of said metal casing.

6. The retractable USB memory stick as claimed in claim 1, wherein said longitudinal sliding slot of said metal casing is located on one lateral sidewall of said metal casing.

7. The retractable USB memory stick as claimed in claim 1, wherein said insulation PC board holder further comprises two guide blocks located on said spring strip and respectively disposed at front and rear sides relative to said sliding block and inserted through said sliding slot of said metal casing.

8. A retractable USB memory stick, comprising:
   a metal casing comprising opposing front and rear sides, a longitudinal sliding slot located on one lateral sidewall thereof, a first locating hole and a second locating hole respectively extending across said longitudinal sliding slot near two distal ends thereof, a front opening located on the front side, and a hook extended from the rear side of said metal casing and defining the rear side of said metal casing an access gap;
   a PC board, said PC board comprising a memory IC board and a USB plug located on a front side of said memory IC board; and
   an insulation PC board holder slidably mounted in said metal casing, said insulation PC board holder comprising a recess defined in a bottom side thereof for accommodating said PC board, a spring strip bridged on one lateral sidewall thereof corresponding to said longitudinal sliding slot of said metal casing, a sliding block located on said spring strip and inserted into said sliding slot of said metal casing to guide sliding movement of said insulation PC board holder in and out of said front opening of said metal casing between a received position and an extended position, two retaining blocks protruded from two opposite lateral sides of said sliding block for selectively engaging said first locating hole or said second locating hole of said metal casing to lock said insulation PC board holder to said metal casing in one of said received position and said extended position, and a latch extended from a rear side thereof for stopping against said hook to close said access gap when said insulation PC board holder is moved into the inside of said metal casing and received in said received position, said latch being kept away from said hook to open said access gap when said insulation PC board holder is moved out of said received position to said extended position.

* * * * *